United States Patent
Lim

(10) Patent No.: US 7,122,397 B2
(45) Date of Patent: Oct. 17, 2006

(54) METHOD FOR MANUFACTURING CMOS IMAGE SENSOR

(75) Inventor: Keun Hyuk Lim, Chungcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 238 days.

(21) Appl. No.: 10/948,567

(22) Filed: Sep. 24, 2004

(65) Prior Publication Data

US 2005/0064621 A1    Mar. 24, 2005

(30) Foreign Application Priority Data

Sep. 24, 2003  (KR) .................. 10-2003-0066124

(51) Int. Cl.
*H01L 21/00*   (2006.01)

(52) U.S. Cl. ..................... 438/60; 438/73; 438/75; 438/98; 438/57

(58) Field of Classification Search ............. None
See application file for complete search history.

(56) References Cited

U.S. PATENT DOCUMENTS

| 6,040,592 | A | | 3/2000 | McDaniel et al. |
| 6,083,847 | A | * | 7/2000 | Kuo .......................... 438/745 |
| 6,160,282 | A | * | 12/2000 | Merrill ....................... 257/292 |
| 6,344,668 | B1 | | 2/2002 | Hatano et al. |
| 6,495,434 | B1 | | 12/2002 | Rhodes |
| 6,642,076 | B1 | * | 11/2003 | Yaung et al. ................. 438/48 |

* cited by examiner

*Primary Examiner*—Zandra V. Smith
*Assistant Examiner*—Khanh Duong
(74) *Attorney, Agent, or Firm*—Finnegan, Henderson, Farabow, Garrett & Dunner, L.L.P.

(57) ABSTRACT

A method for manufacturing a CMOS image sensor includes depositing a gate oxide film and polysilicon on a substrate, forming a gate electrode by patterning and etching the gate oxide layer and the polysilicon, wherein the polysilicon of the gate electrode extends to an active region of the substrate, forming spacers on the sidewalls of the gate electrode, forming a mask pattern having an opening over the active region, removing the spacers and the gate oxide layer thereunder in the active region, removing the mask pattern, depositing a protective layer on a pixel region of the substrate, and conducting a salicide formation process on the resulting structure.

6 Claims, 10 Drawing Sheets

METHOD FOR MANUFACTURING CMOS IMAGE SENSOR

RELATED APPLICATION

This application is based on and claims benefit of priority to Korean Patent Application No. 10-2003-0066124, filed on Sep. 24, 2004, the entire contents of which are incorporated herein by reference.

BACKGROUND

1. Technical Field

The present disclosure relates to a complementary metal oxide semiconductor (hereinafter referred to as "CMOS") image sensor and, more particularly, to a CMOS image sensor manufacturing method which can reduce current leakage and resistance generated during an active contact formation.

2. Description of Related Art

Typically, an image sensor converts optical images to electric signals. The types of image sensors are largely divided into a CCD (charge coupled device) type and a CMOS type. A CCD type image sensor comprises several MOS (metal oxide semiconductor) capacitors, closely positioned to one another, wherein electric charge carriers are transferred to or saved in the MOS capacitors. A CMOS type image sensor employs a CMOS technology (i.e., both a control circuit and a signal processing circuit are used as a peripheral circuit). According to the CMOS technology, the CMOS image sensor has as many MOS transistors as pixels and detects the outputs of the pixels using the MOS transistors. In other words, the CMOS image sensor adopts a switching method.

In recent years, to improve the photo-sensitivity of image sensors, various researches have been conducted. One of the intensively researched areas is a light-collecting technology. A CMOS image sensor may comprise photodiodes for detecting light and a CMOS logic circuit for generating data by converting the detected light into an electric signal. To achieve a high photo-sensitivity in the CMOS image sensor, the light-collecting technology has been developed toward increasing the ratio of the area of the photodiodes to the entire area of the image sensor.

In contrast to CCDs, CMOS type image sensors may be highly integrated. Particularly, a salicide formation process comprising a step of forming a salicide layer made of Ti or Co on gate electrodes and source/drain regions, may be performed for the image sensors employing a line width of less than 0.25 μm.

A prior art method for fabricating an image sensor may be described with reference to FIGS. 1a and 1b. As shown in FIG. 1a, an image sensor 10 includes a plurality of transistors 12, e.g., 12-1, 12-2, 12-3, and a photodiode 14. Each transistor 12 includes a gate 16, i.e., 16-1, 16-2, 16-3, and source/drain regions labeled as S/D in FIG. 1a. Also shown in FIG. 1a is an active region 18 defined between transistor 12-1 and photodiode 14. Active region 18 is connected to gate 16-2 of transistor 12-2.

Image sensor 10 may be formed on a semiconductor substrate. First, a field insulating layer is partially formed on the semiconductor substrate. A layer of gate oxide and is formed on areas separated by the field insulating layer and gate electrodes are formed on the layer of gate oxide. Photodiode 14 and S/D regions are formed by an ion implantation process. The semiconductor layer comprises a high concentration P++ and P type epitaxial layer. A metallic layer such as a Ti layer is then grown on the surface of the resulting structure with a thickness between 300 Å and 500 Å by a sputtering method.

A silicide is then formed through a rapid thermal process (hereinafter referred to as "RTP") at a temperature about 730° C. and for about 20 minutes. The RTP is conducted in an $N_2$ atmosphere, leading to the reaction of Si and Ti metals. As a result, a silicide layer made of $TiSi_2$ is formed.

Optionally, a salicide formation process may then be performed. Because oxide does not react with Ti, the unreacted residues of the Ti may remain on the gate oxide layer. Thus, a predetermined cleaning process is required to remove the unreacted residues of the Ti. Subsequently, another RTP is conducted at a temperature about 850° C. to form the salicide layer. The RTP is conducted in a $N_2$ atmosphere, resulting in the formation of the salicide layer. The formed salicide layer reduces resistance generated during the formation of a contact, such as a floating diffusion.

An interlayer dielectric layer is then formed to insulate an area between the gate electrode and a first metal contact layer. Next, the interlayer dielectric layer is selectively etched to make a contact area on the metallic layer. A pattern of the first metal contact layer is formed on the contact area.

As shown in FIG. 1a, two first metal contacts, 20-A and 20-B are formed on active region 18 and gate electrode 16-2, respectively. The prior art simultaneously makes the two first metal contacts 20-A and 20-B. However, as shown in FIG. 1b, active region 18 may be over-etched during the formation of contacts 20-A and 20-B. The over-etching of active region 18 damages the inside silicon substrate, and consequently, changes the amount of current leakage and the value of resistance.

U.S. Pat. No. 6,040,592 to Bart et al. discloses an image sensor having a well-to-substrate diode as a photodetector by utilizing a modem salicide process to manufacture the image sensor.

U.S. Pat. No. 6,495,434 to Howard E et al. discloses an imaging device formed as a CMOS semiconductor integrated circuit which includes a buried contact line between a floating diffusion region and a gate of a source follower output transistor.

U.S. Pat. No. 6,344,668 to Keisuke et al. discloses an image pickup element unit and peripheral circuits which are formed on a common semiconductor substrate. The image pickup element unit comprises sensors which converts incident lights into charges. The peripheral circuits comprise contact holes therein and transfer signals to external components via the contact holes.

SUMMARY

It is therefore desirable to provide a method for manufacturing a CMOS image sensor that obviates one or more problems due to limitations and disadvantages of the related art.

Consistent with the present invention, there is provided a CMOS image sensor manufacturing method for reducing leakage current and contact resistance and minimizing damages on the surface of a substrate by extending a gate electrode up to an active region and forming a salicide layer.

Consistent with embodiments of the present invention, there is provided a method for fabricating a semiconductor device having an active region. The method includes depositing a gate oxide film and polysilicon on a substrate; forming a gate electrode by etching the gate oxide layer and the polysilicon, wherein the polysilicon of the gate electrode extends to the active region; forming spacers on the sidewalls of the gate electrode; forming a mask pattern having an opening over the active region; removing the spacers and the gate oxide layer thereunder in the active region; removing the mask pattern; depositing a protective layer on a pixel region of the substrate; and conducting a salicide formation process on the resulting structure.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings;

FIG. 2b is a cross-sectional view of the CMOS image sensor of FIG. 2a;

DETAILED DESCRIPTION OF THE PREFERRED EMBODIMENT

Reference will now be made in detail to embodiments of the invention, examples of which are illustrated in the accompanying drawings. Wherever possible, the same reference numbers will be used throughout the drawings to refer to the same or like parts.

Figure 2A:
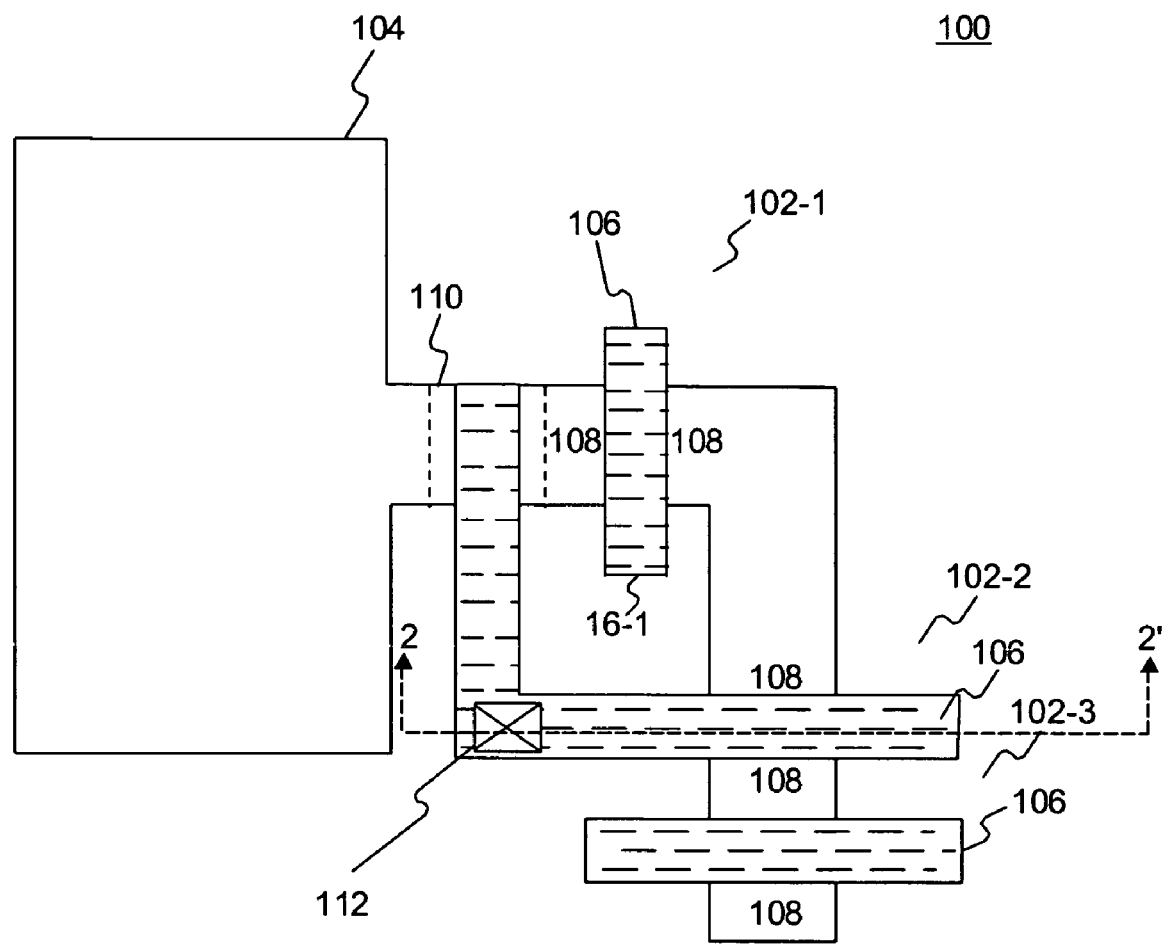
FIG. 2a is a top-sectional view of a CMOS image sensor consistent with an embodiment of the present invention.
Figure 2B:
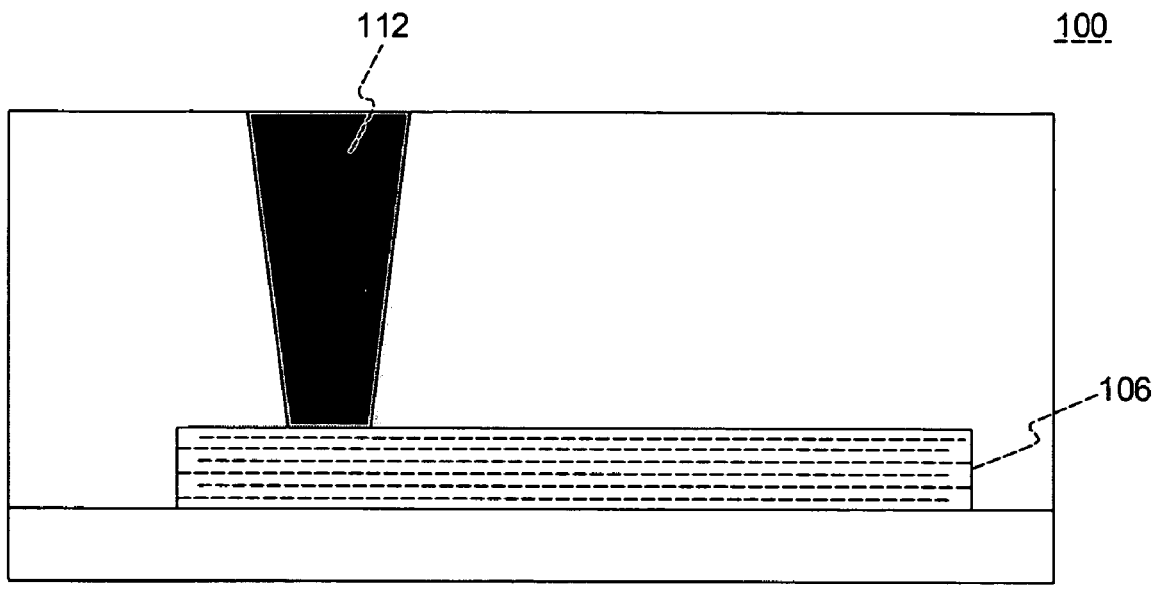

FIG. 2a illustrates a top view of a CMOS image sensor 100 consistent with an embodiment of the present invention and FIG. 2b shows a partial cross-sectional view of CMOS image sensor 100 along line 2–2' of FIG. 2a. As shown in FIG. 2a, image sensor 100 includes a plurality of transistors 102, e.g., 102-1, 102-2, 102-3, and a photodiode (not numbered) formed in a pixel region 104. Each transistor 102 includes a gate electrode 106 and source/drain regions 108, as shown in FIG. 2a. Also shown in FIG. 2a is an active region 110 defined between transistor 102-1 and pixel region 104. In the exemplary configuration of CMOS image sensor 100 as shown in FIG. 2a, transistor 102-2 is a drive transistor and active region 110 is connected to gate electrode 106 of transistor 102-2.

Figure 1A:
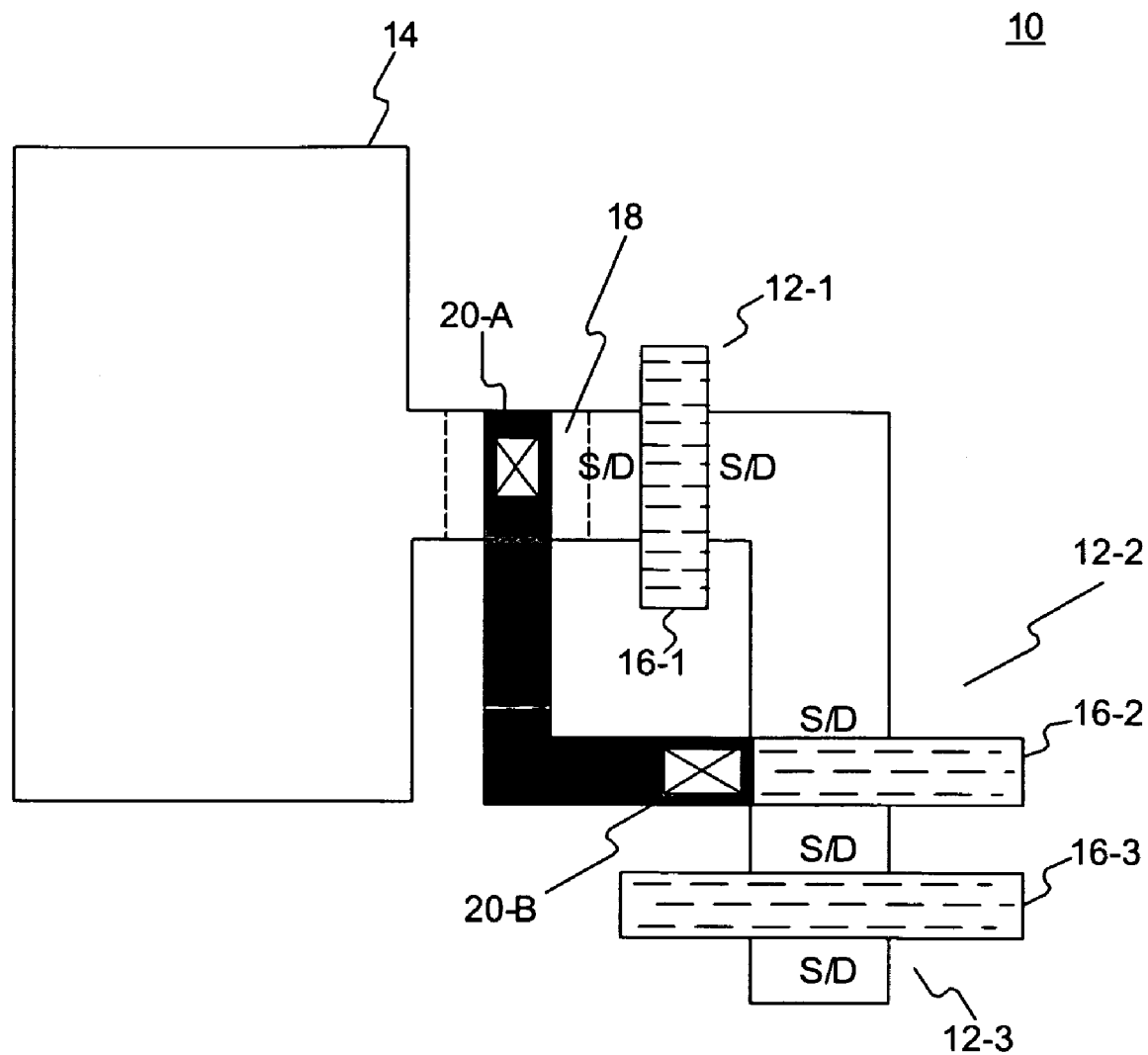
FIG. 1a is a top view illustrating a CMOS image sensor according to the prior art.
Figure 1B:
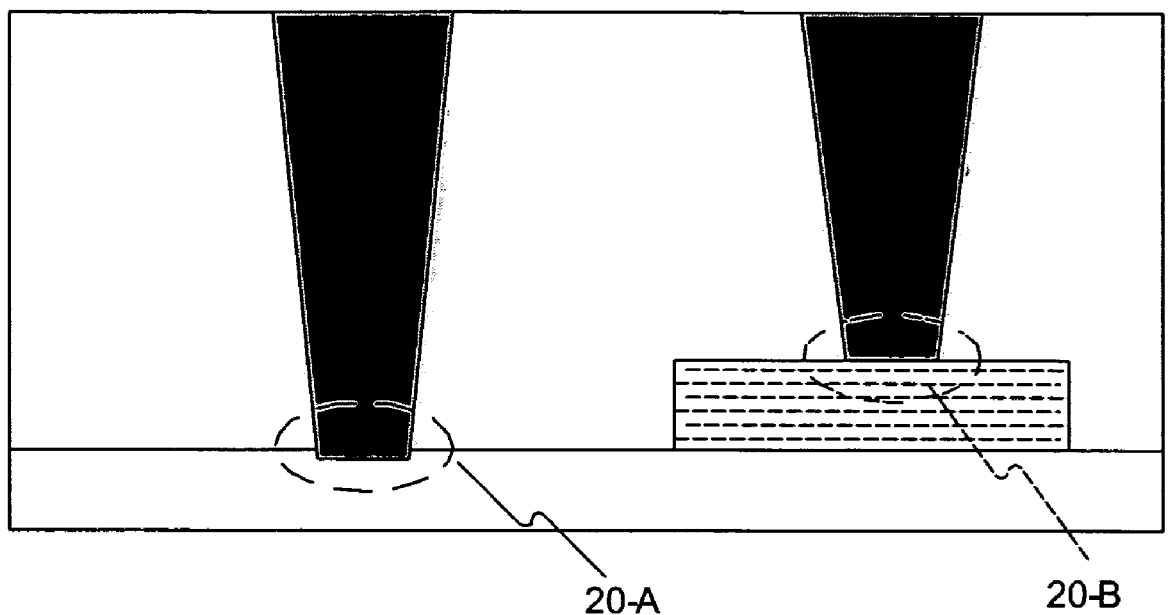
FIG. 1b is a cross-sectional view illustrating a CMOS image sensor according to the prior art.

In one aspect, gate electrodes 106 of transistors 102 comprise polysilicon and active region 110 is covered by horizontally extending the polysilicon of gate electrode 106 of transistor 102-2, as shown in FIG. 2a. A salicide process may then be performed to connect the extended polysilicon to active region 110. Consequently, a later metallic interconnect process only needs to form one single contact 112 on gate electrode 106 of transistor 102-2, as shown in FIG. 2b, in contrast to two first metal contacts 20-A and 20-B on both active region 18 and gate electrode 16-2 as required by the prior art, as shown in FIGS. 1a and 1b.

FIGS. 3a–3f are top views illustrating an exemplary process for manufacturing image sensor 100 consistent with an embodiment of the present invention. FIGS. 4a–4f illustrate corresponding cross-sectional views of image sensor 100 during the manufacturing process along lines A–A' as shown in FIGS. 3a–3f.

Figure 3A:
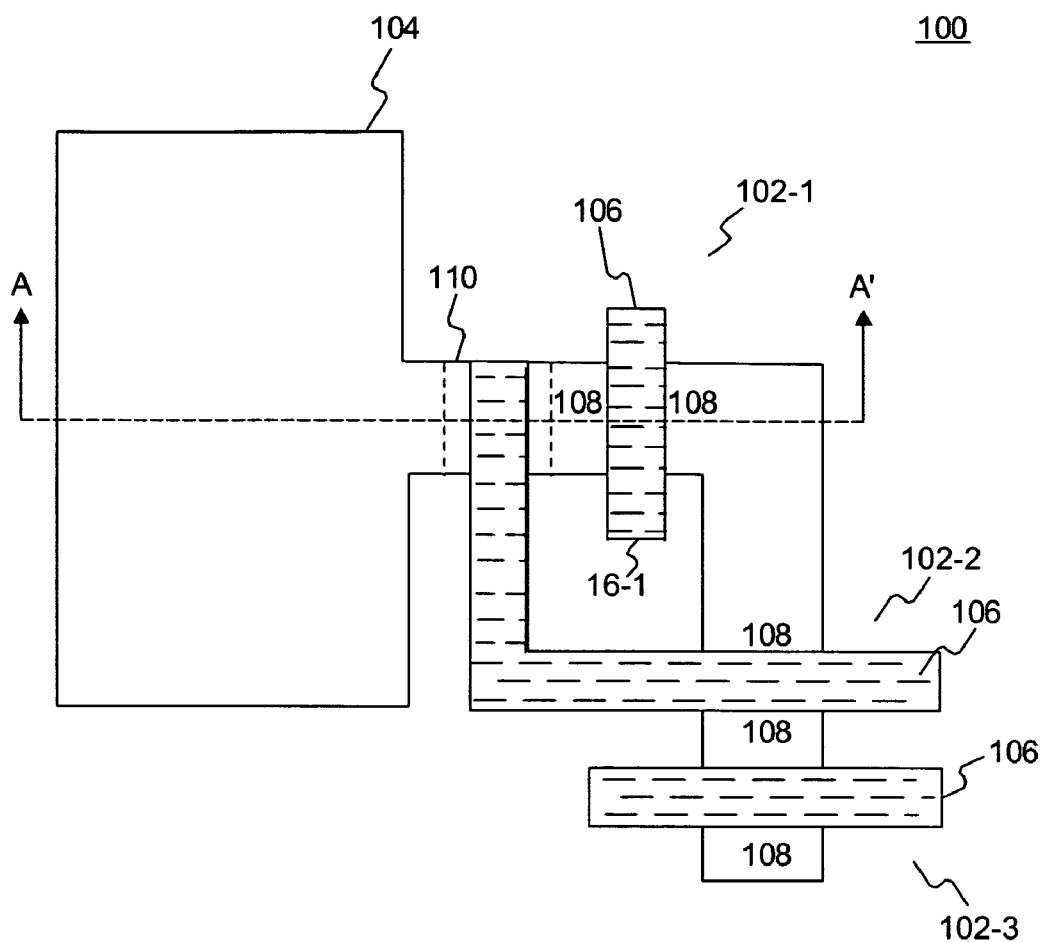
FIG. 3a through FIG. 3f are top views illustrating an exemplary process for manufacturing a CMOS image sensor consistent with an embodiment of the present invention.
Figure 4A:
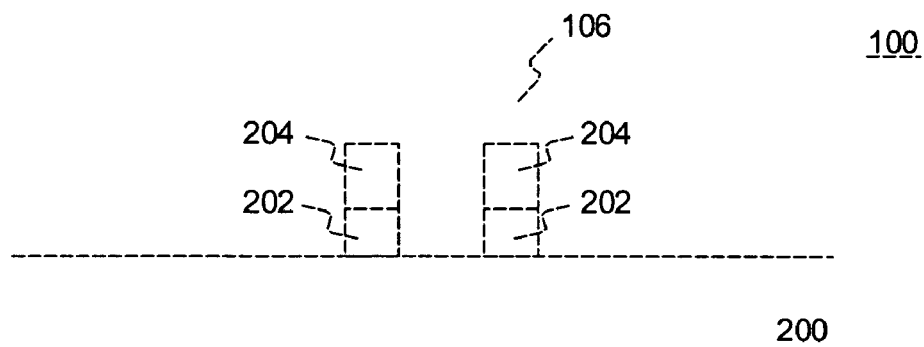
FIGS. 4a–4f respectively illustrate cross-sectional views of the CMOS image sensor corresponding to the manufacturing process illustrated in FIGS. 3a–3f along lines A–A' as shown in FIGS. 3a–3f.

Referring to FIGS. 3a and 4a, a gate oxide layer 202 is deposited on a top surface of a substrate 200. A layer of polysilicon 204 is then deposited on gate oxide layer 202. Gate electrodes 106 are then formed by etching a predetermined portion of gate oxide layer 202 and polysilicon 204 using a well-known photolithography process. As shown in FIGS. 3a and 4a, the portion of polysilicon 204 that constitutes gate electrode 106 of drive transistor 102-2 is extended up to active region 110.

Figure 3B:
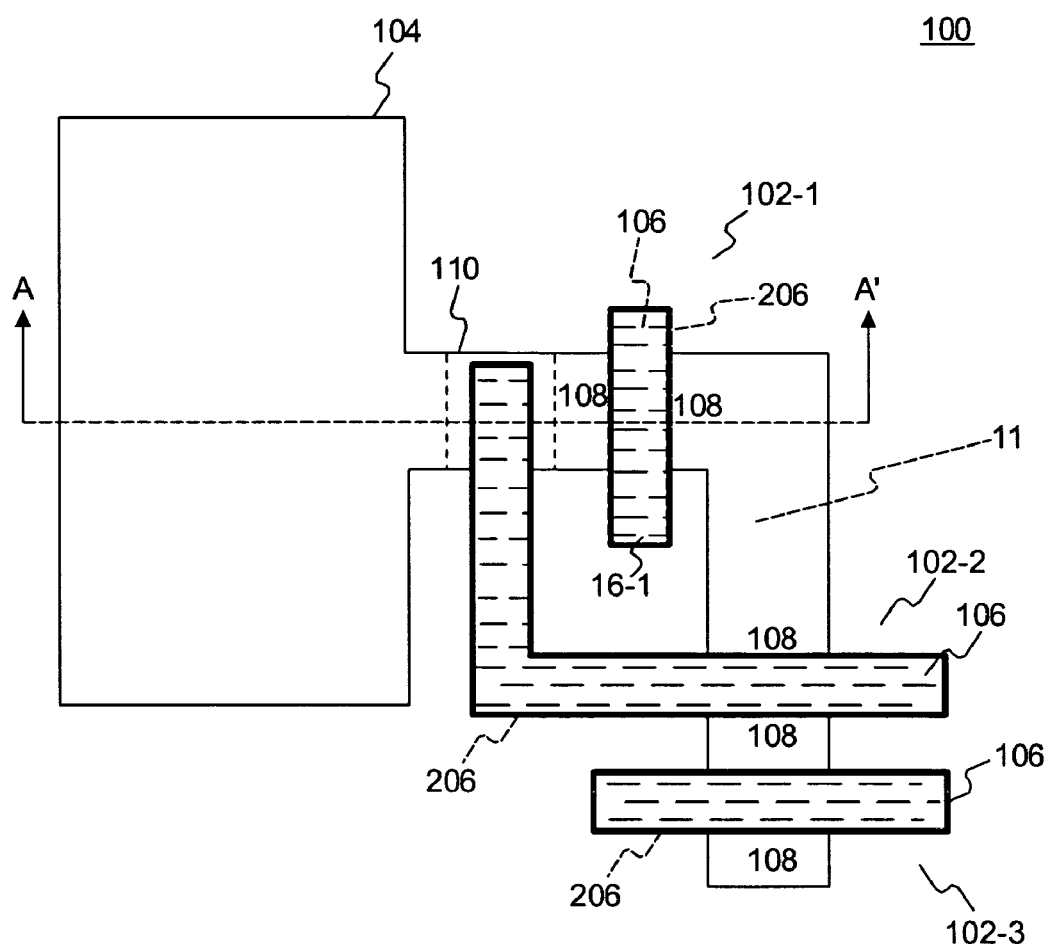
Figure 4B:
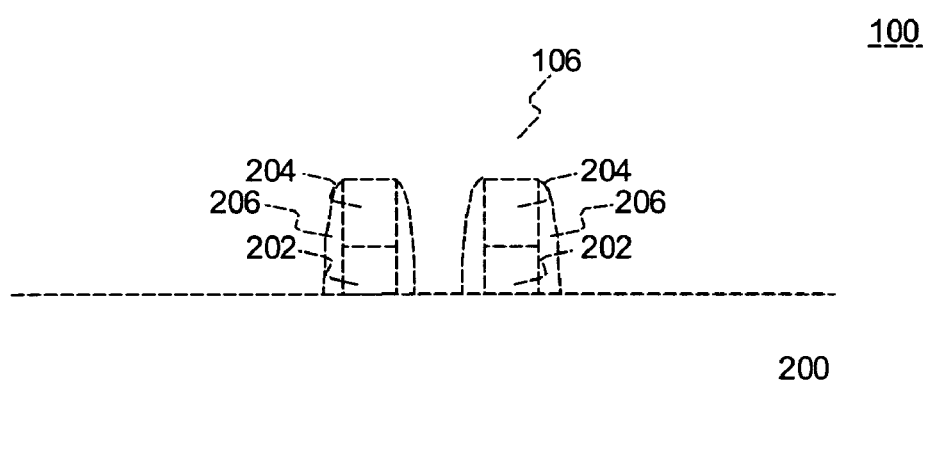

Referring to FIGS. 3b and 4b, a nitride layer for forming spacers 206 is deposited on the resulting structure. Subsequently, spacers 206 are formed on the sidewalls of gate electrodes 106 by etching the nitride layer. In one aspect, spacers 206 comprise SiN.

Figure 3C:
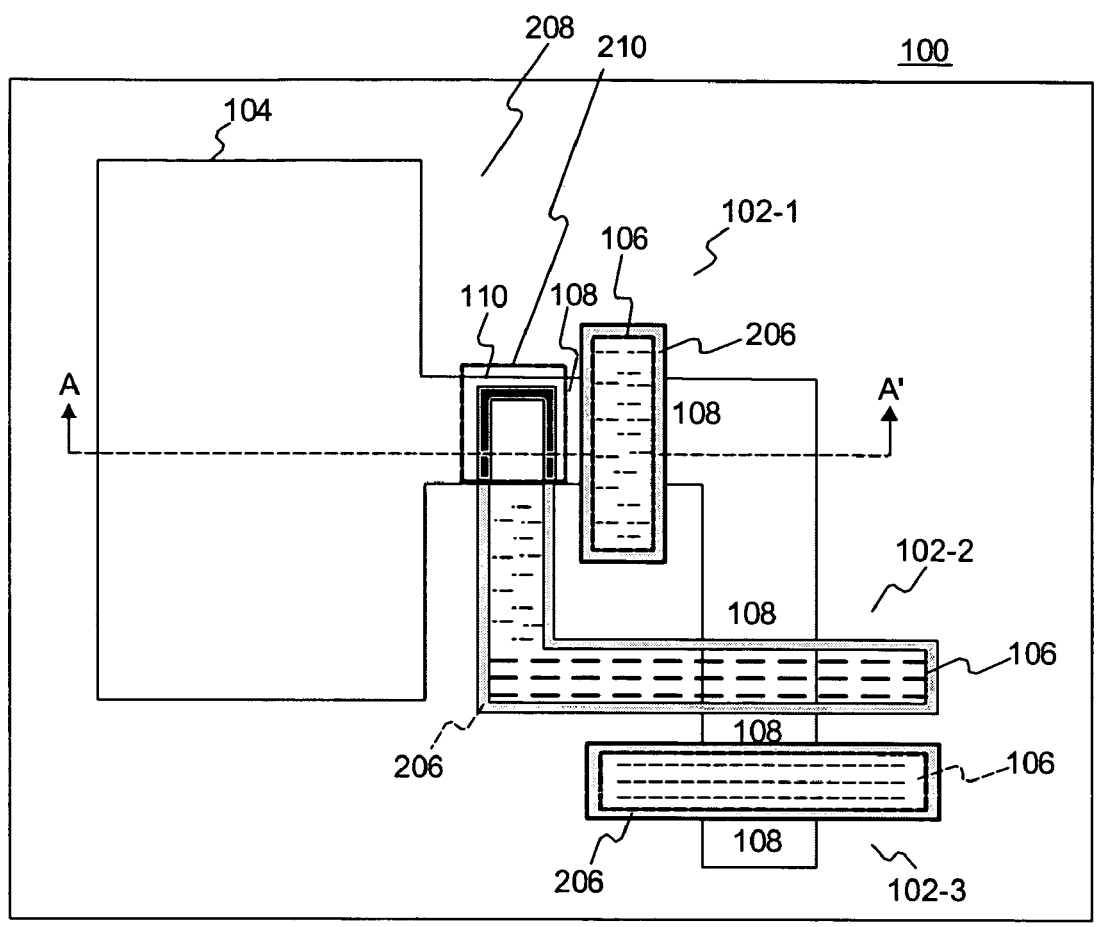
Figure 4C:
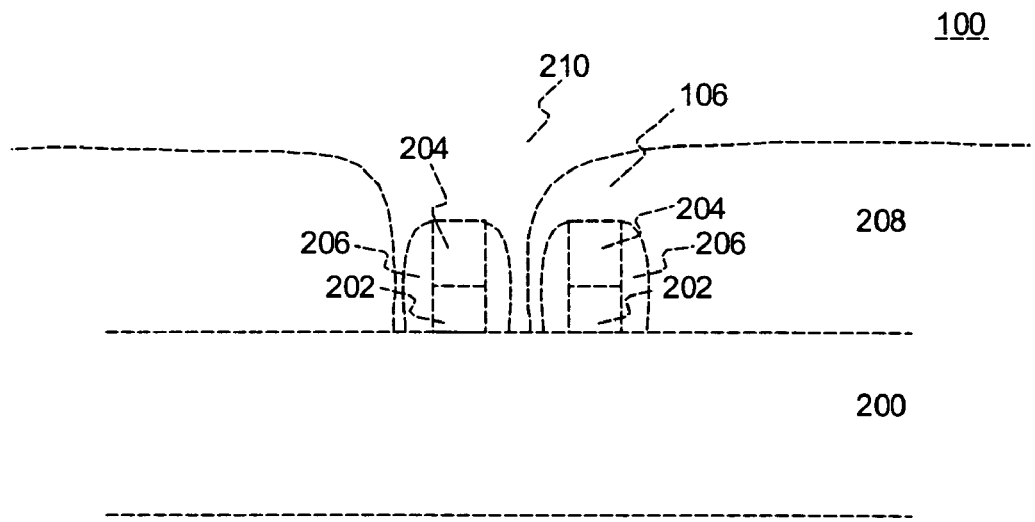

Referring to FIGS. 3c and 4c, a photoresist pattern 208 is formed on the resulting structure. Photoresist pattern 208 includes an opening 210 exposing active region 110.

Figure 3D:
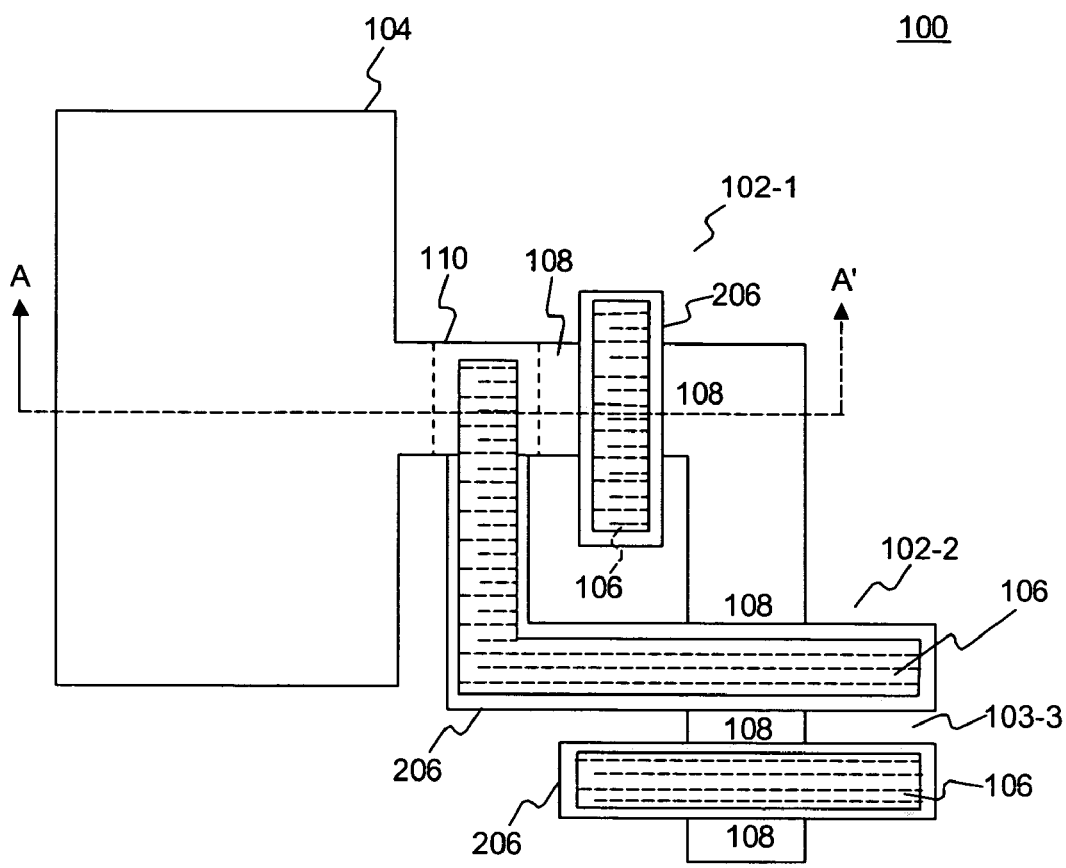
Figure 4D:
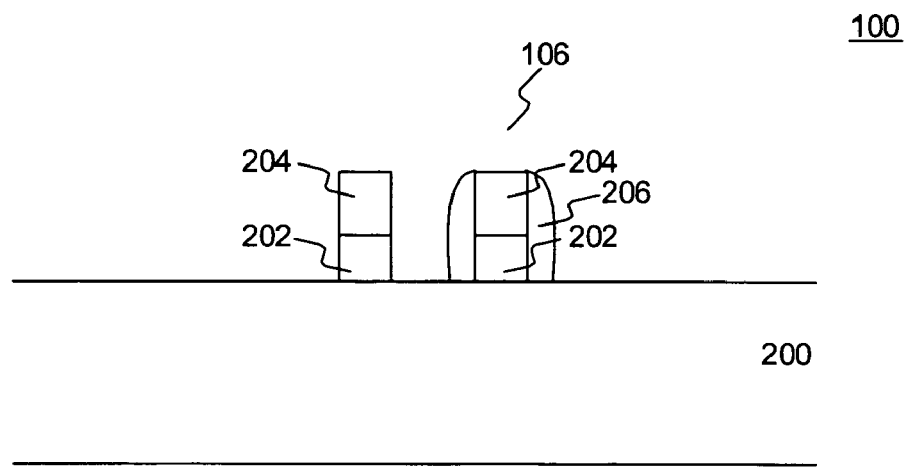

Referring to FIGS. 3d and 4d, spacers 206 in active region 110 on the sidewalls of gate electrode 106 of transistor 102-2 and the gate oxide layer 202 thereunder are removed by etching processes (e.g., wet etching or dry etching). Because spacers 206 and gate oxide layer 202 do not react with metal and would prevent formation of a salicide layer connecting the gate electrode 106 of transistor 102-2 and active region 110, spacers 206 and the oxide layer should be removed from active region 110. Gate oxide layer 202 under spacers 206 may be removed by dry-etching (e.g., reactive ion etching). Spacers 206 may be removed by wet-etching. Subsequently, photoresist pattern 208 is removed.

Figure 3E:
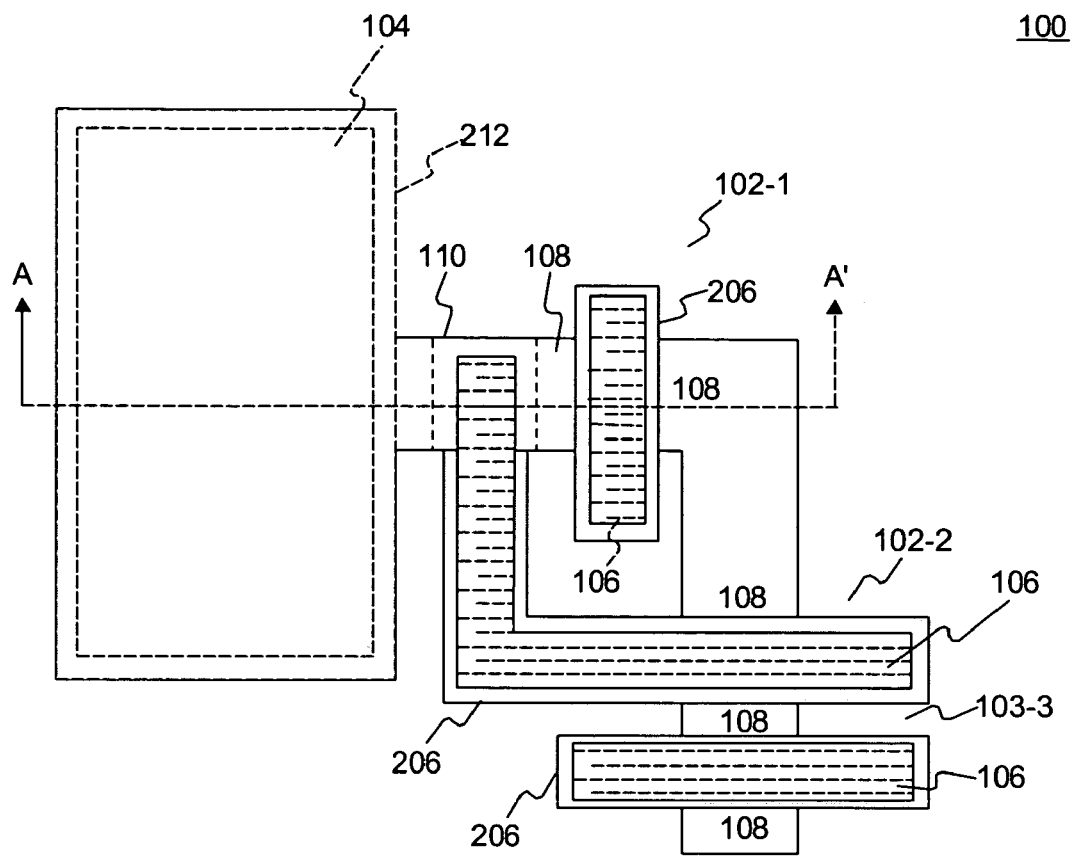
Figure 4E:
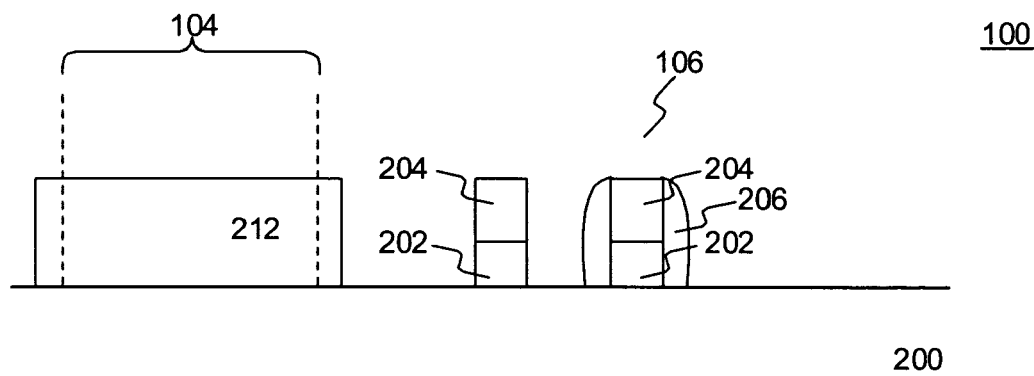

Referring to FIGS. 3e and 4e, to protect pixel region 104 during a later salicide formation process, a protective layer 212 is formed on pixel region 104. In one aspect, protective layer 212 comprises tetraethyl ortho-silicate (hereinafter referred to as "TEOS").

Figure 3F:
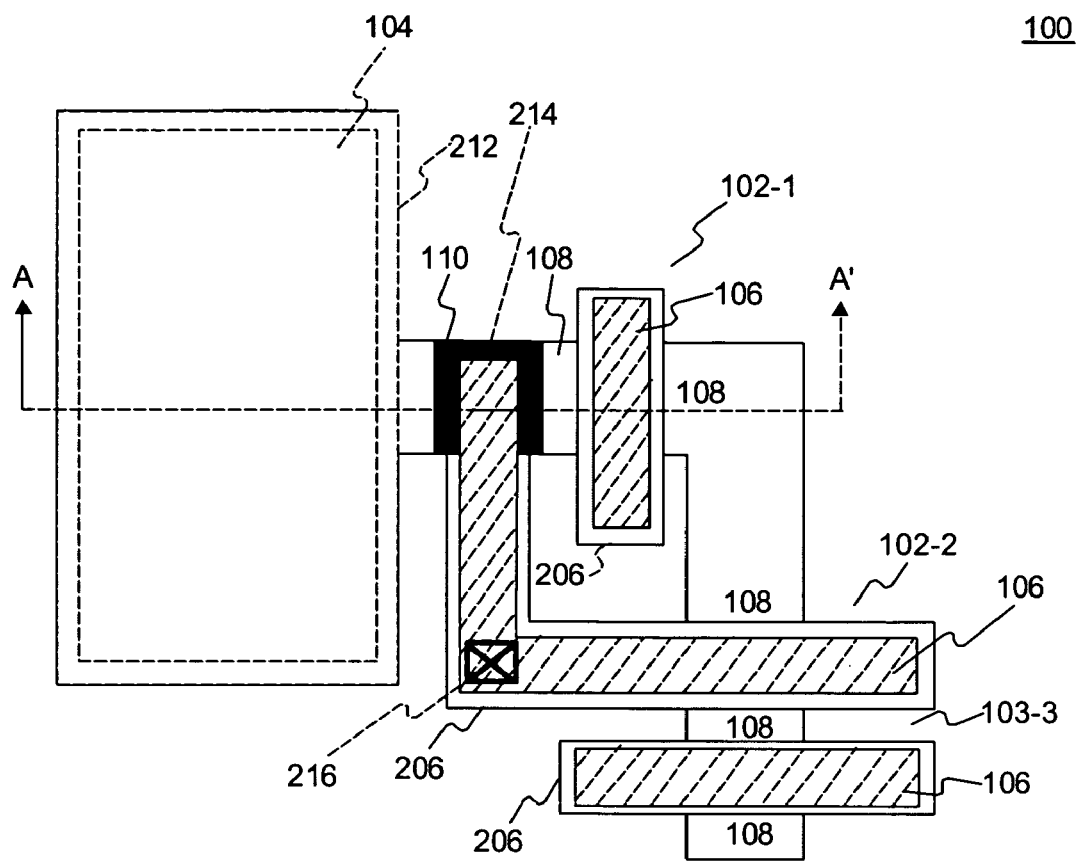
Figure 4F:
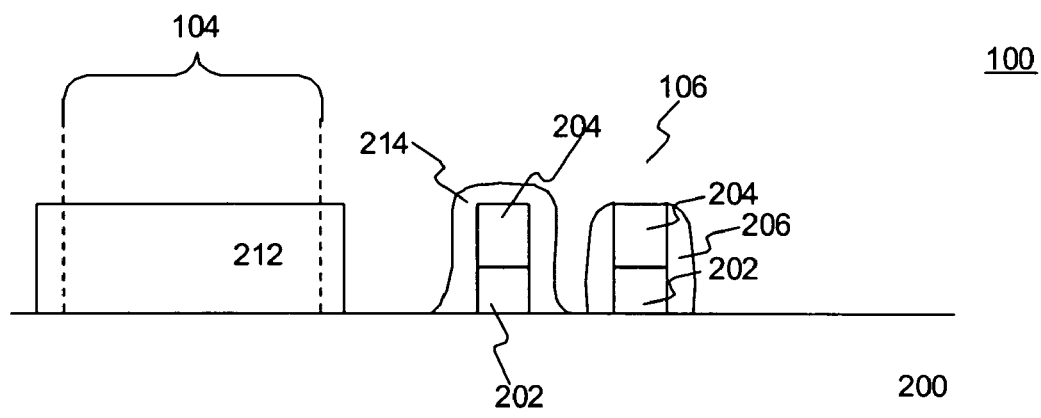

FIGS. 3f and 4f illustrate the resulting structure after the salicide formation process. Referring to FIG. 3f, a salicide layer 214 for connecting active region 110 with gate electrode 106 of transistor 102-2 is formed on the resulting structure. As a result, only one single contact 216 needs to be provided on gate electrode 106 of transistor 102-2 during the later metallic interconnect process consistent with the present invention. Accordingly, a leakage current due to the contact on the surface of the silicon substrate, which causes critical problems during an image sensor manufacturing process, is greatly decreased.

Accordingly, the present invention extents the gate electrode to the active region, and connects the gate electrode with the active region using the salicide layer. Thus, only a single contact is needed for the gate electrode during the later metallic interconnect process instead of forming contacts on both the gate electrode and the active region, thereby decreasing the leakage current and resistance and minimizing damages to the surface of the silicon substrate.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for fabricating a CMOS image sensor having an active region, comprising:

depositing a gate oxide film and polysilicon on a substrate;

forming a gate electrode by etching the gate oxide layer and the polysilicon, wherein the polysilicon of the gate electrode extends to the active region;

forming spacers on the sidewalls of the gate electrode;

forming a mask pattern having an opening over the active region;

removing the spacers and the gate oxide layer thereunder in the active region;

removing the mask pattern;

depositing a protective layer on a pixel region of the substrate; and conducting a salicide formation process on the resulting structure.

2. The method as defined by claim 1, wherein the spacers comprise SiN.

3. The method as defined by claim 1, wherein the spacers are removed by wet-etching.

4. The method as defined by claim 1, wherein the gate oxide layer under the spacers is removed by dry-etching.

5. The method as defined by claim 1, wherein the protective layer comprises TEOS.

6. The method as defined by claim 1, wherein the salicide formation process forms a salicide layer which connects the polysilicon of the gate electrode with the active region.

* * * * *